(12) United States Patent
Greenstreet

(10) Patent No.: US 6,686,854 B2
(45) Date of Patent: Feb. 3, 2004

(54) METHOD AND APPARATUS FOR LATCHING DATA BASED ON A PREDETERMINED NUMBER OF SIGNAL LINE TRANSITIONS

(75) Inventor: Mark R. Greenstreet, Vancouver (CA)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/317,507

(22) Filed: Dec. 12, 2002

(65) Prior Publication Data
US 2003/0222802 A1 Dec. 4, 2003

Related U.S. Application Data

(63) Continuation-in-part of application No. 10/156,160, filed on May 28, 2002, now Pat. No. 6,621,427.

(51) Int. Cl.$^7$ .............................. H03M 7/00; H03M 5/00
(52) U.S. Cl. ........................................... 341/50; 341/51
(58) Field of Search ............................... 341/58, 50, 51, 341/59; 365/226; 340/7.26

(56) References Cited

U.S. PATENT DOCUMENTS

| | | | | |
|---|---|---|---|---|
| 5,369,682 A | * | 11/1994 | Witsaman et al. | 340/7.26 |
| 5,430,682 A | * | 7/1995 | Ishikawa et al. | 365/226 |
| 5,686,913 A | * | 11/1997 | Coln et al. | 341/51 |
| 6,369,724 B1 | * | 4/2002 | Nakagawa | 341/59 |

* cited by examiner

Primary Examiner—Jean Bruner Jeanglaude
(74) Attorney, Agent, or Firm—Park, Vaughn & Fleming LLP

(57) ABSTRACT

One embodiment of the present invention provides a system that keeps track of transitions on signal lines in order to latch a dataword in a stream of datawords. This stream of datawords is generated so that each transition between successive datawords involves a minimum number of transitions on a set of signal lines. During operation, the system monitors the set of signal lines that carries the stream of datawords. Upon detecting a predetermined number of transitions on the set of signal lines, the system waits a fixed time interval to ensure that a dataword is ready to be latched, and then latches the dataword.

28 Claims, 8 Drawing Sheets

METHOD AND APPARATUS FOR LATCHING DATA BASED ON A PREDETERMINED NUMBER OF SIGNAL LINE TRANSITIONS

RELATED APPLICATION

This application is a continuation-in-part of, and hereby claims priority under 35 U.S.C. §120 to, U.S. patent application Ser. No. 10/156,160 filed on May 28, 2002, is now a U.S. Pat. No. 6,621,427, by inventor Mark R. Greenstreet, entitled "Method and Apparatus for Implementing a Doubly Balanced Code".

BACKGROUND

1. Field of the Invention

The present invention relates to techniques for transmitting data through electrical signals. More specifically, the present invention relates to a method and an apparatus that latches a dataword after detecting a predetermined number of signal line transitions, wherein each transition between successive datawords involves a minimum number of transitions on a set of signal lines.

2. Related Art

As processor clock speeds continue to increase at an exponential rate, data must be transferred at correspondingly faster rates between computer system components. Computer systems typically use large parallel busses for this purpose.

These large parallel busses typically use either single-ended signaling or differential signaling. Single-ended signaling makes use of a single signal line to carry each bit, along with one or more clock lines to latch the signals.

In contrast, differential signaling uses two signal lines to carry each bit, wherein the value of the bit is indicated by a voltage difference between the two signal lines. Because currents are balanced between power and ground rails, differential signaling reduces power supply noise and solves the problem of where return currents come from. Moreover, differential signaling is less sensitive to ground shifts between sender and receiver because differential signaling relies on voltage differences between pairs of signal lines, instead of relying on an absolute voltage level of a single signal line.

Unfortunately, differential signaling uses twice as many wires as single-ended signaling, which can greatly exacerbate pin limitation problems.

What is needed is a method and apparatus for transferring data between computer system components without the large number of signal lines required by differential signaling, and without the current balance and ground noise problems of single-ended signaling.

Another problem that has to be dealt with in transferring data across a parallel bus is to efficiently latch the data signals when they are received at a receiver. Many systems include one or more additional clock lines in the parallel bus to carry a clock signal, which is used to latch data at a receiver. These additional clock lines increase the number of signal lines required to transfer the data. Moreover, there is typically a significant amount of "skew" between the clock signal and the rest of the data lines. This means that a latching operation triggered by the clock signal typically has to be delayed to accommodate the worst-case possible skew between the clock signal and the data lines.

Hence, what is needed is a method and an apparatus for latching data from a parallel bus without the above-described problems.

SUMMARY

One embodiment of the present invention provides a system that keeps track of transitions on signal lines in order to latch a dataword in a stream of datawords. This stream of datawords is generated so that each transition between successive datawords involves a minimum number of transitions on a set of signal lines. During operation, the system monitors the set of signal lines that carries the stream of datawords. Upon detecting a predetermined number of transitions on the set of signal lines, the system waits a fixed time interval to ensure that a dataword is ready to be latched, and then latches the dataword.

In a variation on this embodiment, each transition between datawords involves a substantially equal number of rising and falling transitions. In a further variation, each dataword in the stream of datawords has a substantially equal number of ones and zeros.

In a variation on this embodiment, detecting the predetermined number of transitions involves using separate circuits to detect a predetermined number of rising transitions and a predetermined number of falling transitions. Furthermore, latching the dataword involves using separate circuits to latch signal lines involved in rising transitions and signal lines involved in falling transitions.

In a variation on this embodiment, the fixed time interval includes latch setup time. In a further variation, the fixed time interval accounts for the maximum possible skew between when the predetermined number of transitions occurs and when all signals lines for the dataword are valid.

In a variation on this embodiment, the predetermined number of transitions can include any number of transitions, from a single transition to the minimum number of transitions between successive datawords.

In a variation on this embodiment, the predetermined number of transitions is substantially half the minimum number of transitions between successive datawords.

In a variation on this embodiment, detecting the predetermined number of transitions involves performing current summing.

In a variation on this embodiment, the system performs input amplification on the set of signal lines, wherein the input amplification involves performing a voltage averaging operation over the set of signal lines to determine a reference voltage. This voltage averaging can be accomplished by using a current summing circuit.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Transmitter and Receiver

Figure 1:
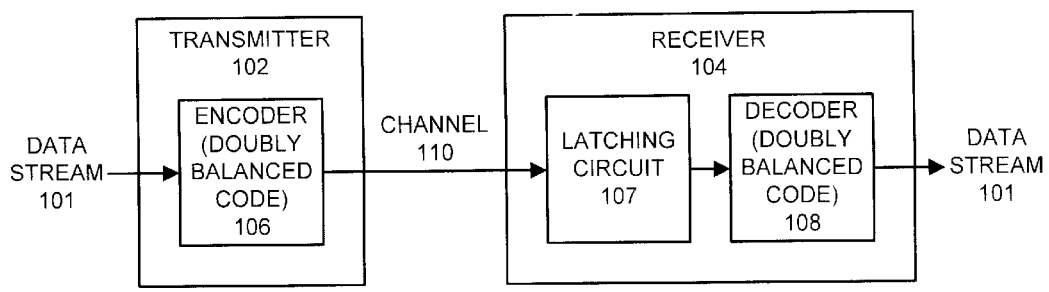
FIG. 1 illustrates a transmitter and a receiver for a doubly balanced code in accordance with an embodiment of the present invention.

FIG. 1 illustrates a transmitter 102 and a receiver 104 for a doubly balanced code in accordance with an embodiment of the present invention. Transmitter 102 receives a data stream 101 comprised of a sequence of datawords. Transmitter 102 encodes these datawords through encoder 106 to produce a corresponding stream of codewords that feeds across channel 110 to receiver 104.

Receiver 104 first latches the stream of codewords in latching circuit 107 and then decodes the stream of codewords using decoder 108 to restore data stream 101. (Although the embodiment of the present invention illustrated in FIG. 1 latches "codewords", latching circuit 107 can more generally be used to latch any type of dataword, and is not meant to be restricted to codewords.) Note that encoder 106 and decoder 108 implement a doubly balanced code, wherein each codeword has a substantially equal number of ones and zeros, and wherein the number of rising transitions is substantially equal for each transition, and the number of falling transitions is substantially equal for each transition. Moreover, for each transition, the number of rising transitions and the number of falling transitions are substantially equal.

Also note that the present invention can generally be applied to any context in which a plurality of signal lines are used to transfer data. In one embodiment, transmitter 102 and receiver 104 are located on different components of a digital system, such as a computer system. In another embodiment, transmitter 102 and receiver 104 are located on different computer systems.

Decoder

Figure 2:
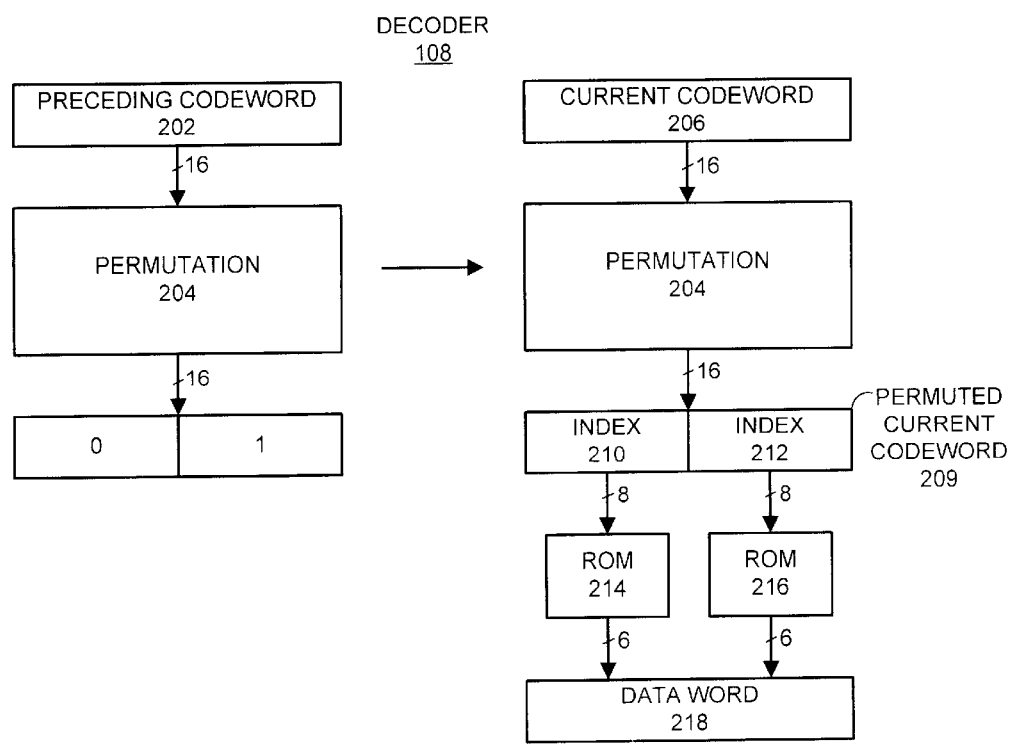
FIG. 2 illustrates the structure of a decoder for a doubly balanced code in accordance with an embodiment of the present invention.

FIG. 2 illustrates the structure of a decoder 108 for a doubly balanced code in accordance with an embodiment of the present invention. Referring to the left-hand side of FIG. 2, decoder 108 operates by first producing a permutation 204 that permutes a preceding codeword 202 so that: (1) zeros and ones are separated; (2) relative ordering is maintained between ones; and (3) relative ordering is maintained between zeros. Note that permutation 204 can be generated using a stable storing network.

Next, a current codeword 206 is permuted using permutation 204 to produce permuted current codeword 209. The left half of permuted current codeword 209 forms an index 210 containing a pattern of zero bits substantially half of which have been inverted in preceding codeword 202 to produce the current codeword 206. Similarly, the right half of permuted current codeword 209 forms an index 212 containing a pattern of zero bits substantially half of which have been inverted in preceding codeword 202 to produce current codeword 206.

Index 210 is used to lookup a corresponding pattern of dataword bits from read-only memory (ROM) 214. At the same time, index 212 is used to lookup a corresponding pattern of dataword bits from ROM 216. The dataword bits from ROM 214 and ROM 216 are concatenated together to produce dataword 218.

Assume that preceding codeword 202 is n bits in size. This implies index 210 and index 212 are each n/2 bits in size. If half of the zero bits associated with index 210 are inverted, there are $$\binom{n/2}{n/4}$$

possible patterns of bit inversions for index 210. This can be translated into $$\left\lfloor \log_2 \binom{n/2}{n/4} \right\rfloor$$

bits of dataword 218. Some embodiments may transmit more information than this because fractional bits from adjacent codewords can be aggregated to transmit additional information.

For example, if n=16 bits, there are $$\binom{8}{4} = 70$$

possible patterns of bit inversions for index 210. Likewise, there are 70 possible patterns of bit inversions for index 212. This yields 70 * 70=4900 codewords. Note that 4096 codewords are sufficient to transmit 12 bits (i.e. $2^{12}$=4096). Thus, each codeword can convey 12 bits of information. Hence, current codeword 206, which is 16 bits in size, can be translated into dataword 218, which is 12 bits in size. Moreover, there also remain 4900−4096=804 "out-of-band" symbols that can be used to for other purposes, such as flow control or to support specific protocols.

Note that ROM 214 can store any possible mapping from the pattern of bit inversions contained in index 210 to possible bit patterns for the first half of dataword 218, so long as a corresponding encoder uses the same mapping. Similarly, ROM 216 can store any possible mapping from the pattern of bit inversions contained in index 212 to possible bit patterns for the second half of dataword 218, so long as a corresponding encoder uses the same mapping.

Encoder

Figure 3:
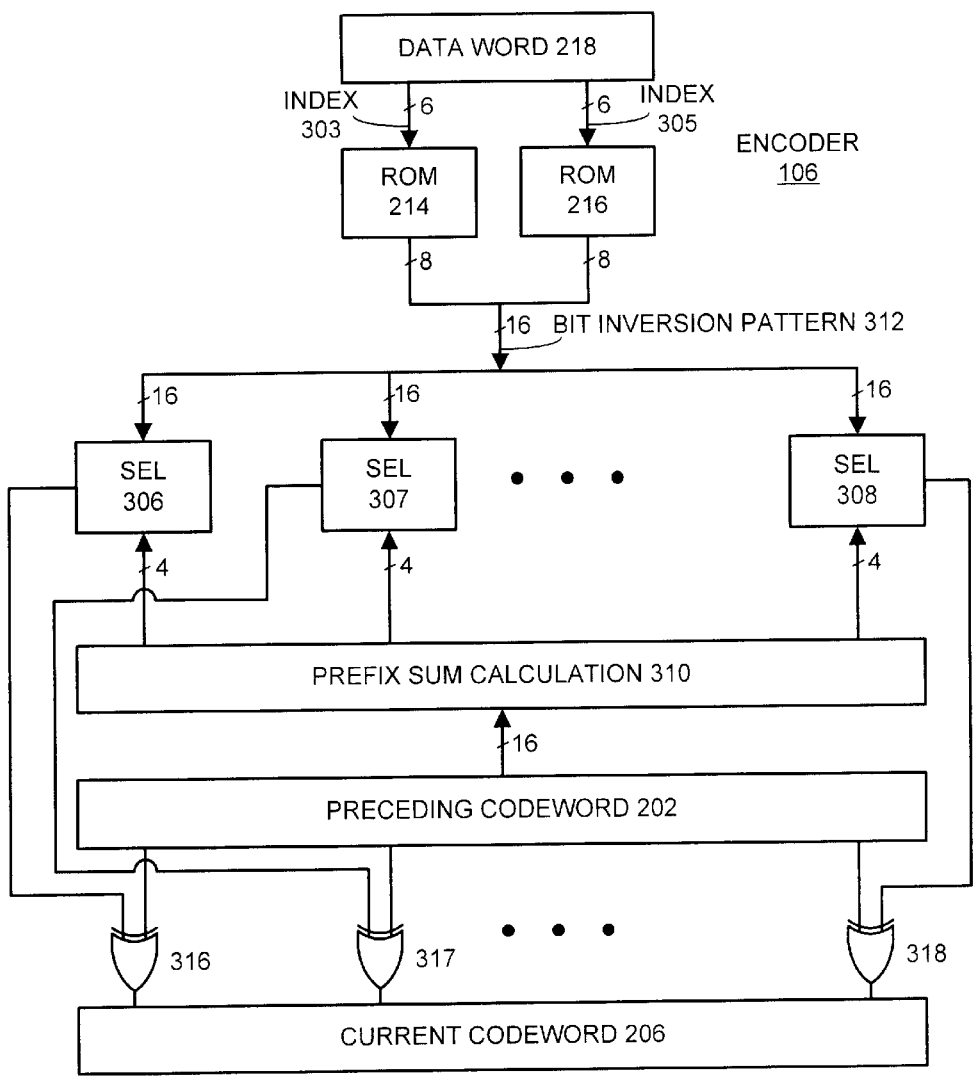
FIG. 3 illustrates the structure of an encoder for a doubly balanced code in accordance with an embodiment of the present invention.

FIG. 3 illustrates the structure of an encoder 106 for a doubly balanced code in accordance with an embodiment of the present invention. Encoder 106 receives a dataword 218. A first half of dataword 218 forms an index 303 that feeds into ROM 302 to produce a pattern of bit inversions for the zero bits of the preceding codeword 202. Similarly, a second half of dataword 218 forms an index 305 that feeds into ROM 304 to produce a pattern of bit inversions for the one bits of the preceding codeword 202.

At the same time, preceding codeword 202 feeds into prefix sum calculation circuit 310 to produce identification lines for each bit of preceding codeword 202. These identification lines indicate whether the bit is a one or a zero, and additionally specify ordering information. For example, an index for the fourth bit of preceding codeword 202 can indicate that the fourth bit is a one, and furthermore that the fourth bit is the third one from left to right in preceding codeword 202.

The identification lines for a given bit of preceding codeword 202 feed into an associated selector circuit 306, such as a multiplexer, that selects a matching bit inversion signal from the outputs of ROMs 302 and 304. This bit inversion signal feeds into an exclusive-OR gate 316 that inverts the bit of preceding codeword 202, if necessary, to produce a corresponding bit of current codeword 206.

Note that the bus widths indicated in FIGS. 2 and 3 are specified for purposes of illustration only. Other embodiments may use other codeword sizes and therefore other widths for intermediate quantities.

Process of Encoding

Figure 4:
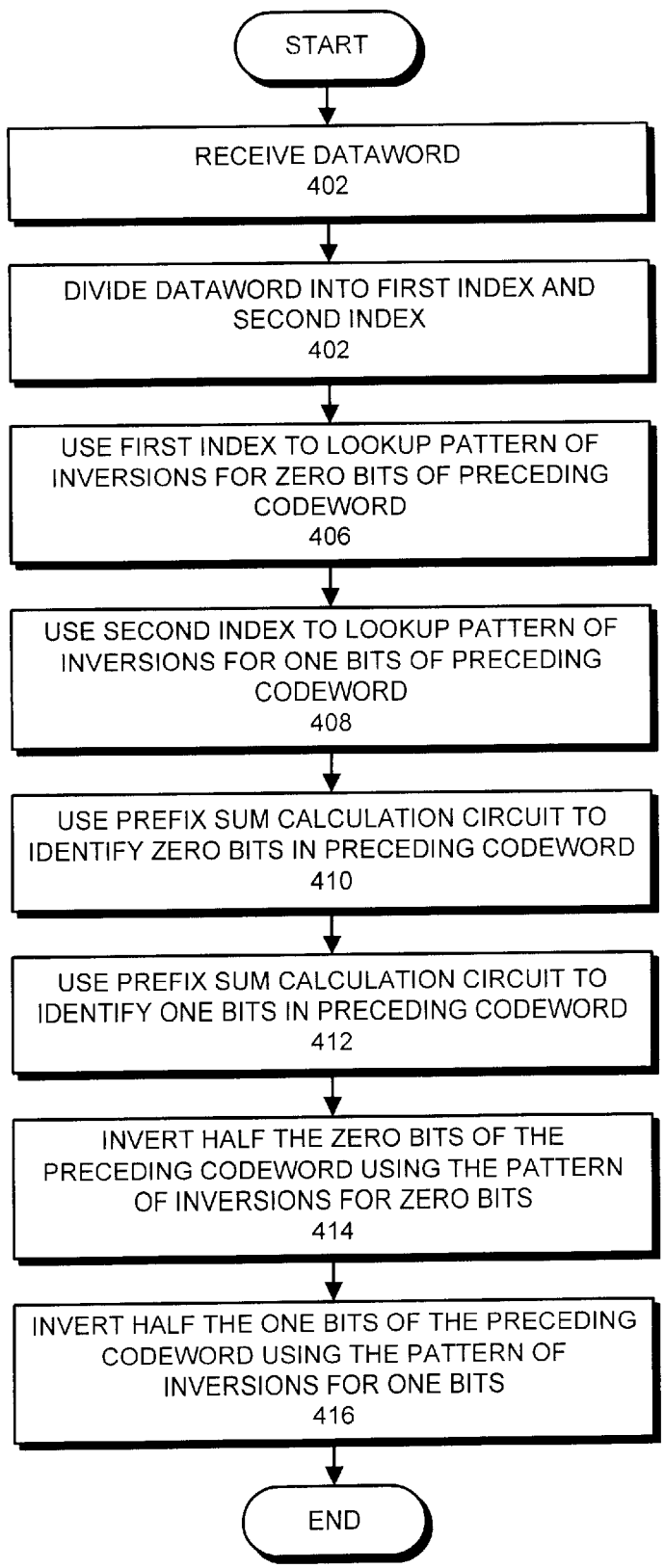
FIG. 4 is a flow chart illustrating the encoding process in accordance with an embodiment of the present invention.

FIG. 4 is a flow chart illustrating the encoding process in accordance with an embodiment of the present invention. The system starts by receiving a dataword 218 (step 402), which is divided into an index 303 and an index 305 (step 404). Next, index 303 is used to lookup or otherwise calculate a pattern of inversions for zero bits of preceding codeword 202 (step 406). At the same time, index 305 is used to lookup or otherwise calculate a pattern of inversions for one bits of preceding codeword 202 (step 408). The pattern of inversions for zero bits from step 406 and the pattern of inversions for one bits from step 408 form a bit inversion pattern 312.

As bit inversion pattern 312 is being computed, preceding codeword 202 also feeds through prefix sum calculation circuit 310 to produce an identifier for each bit in preceding codeword 202. This involves identifying zero bits (step 410), as well as identifying one bits (step 412).

Next, the system uses each identifier to select an inversion bit from bit inversion pattern 312. This inversion bit is used to selectively invert the corresponding bit of preceding codeword 202 to produce current codeword 206. This process inverts half of the zero bits of preceding codeword 202 using the pattern of zero bit inversions from step 406 (step 414). It also inverts half of the one bits of preceding codeword 202 using the pattern of one bit inversions from step 408 (step 416).

Process of Decoding

Figure 5:
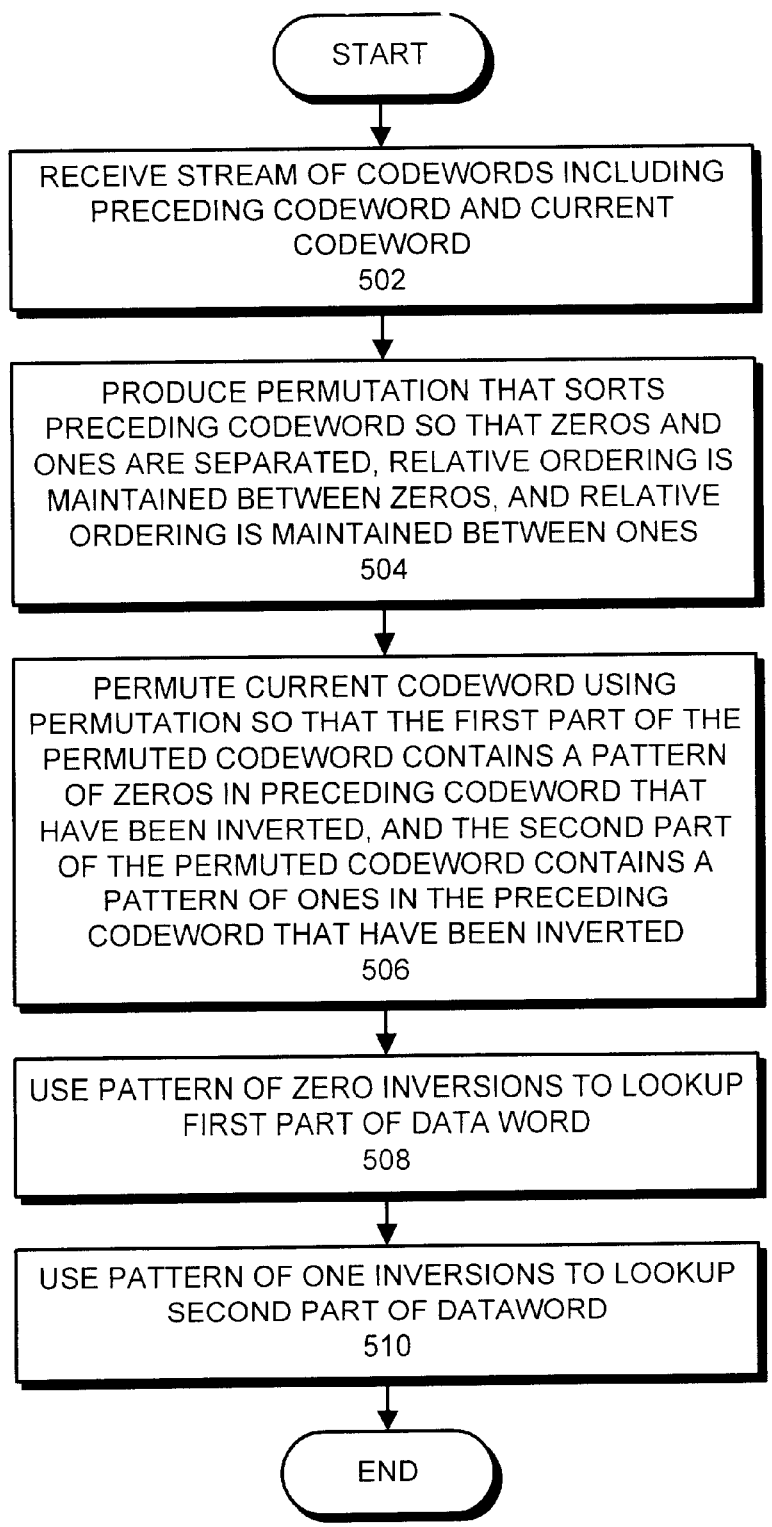
FIG. 5 is a flow chart illustrating the decoding process in accordance with an embodiment of the present invention.

FIG. 5 is a flow chart illustrating the decoding process in accordance with an embodiment of the present invention. During operation, the system receives a stream of codewords, including a preceding codeword 202 and a current codeword 206 (step 502). Next, the system uses preceding codeword 202 to produce a permutation 204 that sorts preceding codeword 202 so that: (1) zeros and ones are separated; (2) relative ordering is maintained between ones; and (3) relative ordering is maintained between zeros (step 504).

The system then permutes current codeword 206 using permutation 204 so that the first part of the permuted current codeword 209 forms an index 210 that contains a pattern of zeros in preceding codeword 202 that have been inverted to produce current codeword 206. Moreover, the second part of the permuted current codeword 209 forms an index 212 that contains a pattern of ones in preceding codeword 202 that have been inverted to produce current codeword 206 (step 506).

Next, the system uses the pattern of zero bit inversions in index 210 to lookup or otherwise calculate a first part of dataword 218 (step 508). At the same time, the system uses the pattern of one bit inversions in index 212 to lookup or otherwise calculate a second part of dataword 218 (step 510). Note that if a lookup is performed using ROMs 214 and 216, the mapping contained in ROM 214 is the inverse of the mapping contained in ROM 302 from FIG. 3. Similarly, the mapping contained in ROM 216 is the inverse of the mapping contained in ROM 304.

Latching Circuit

Figure 6:
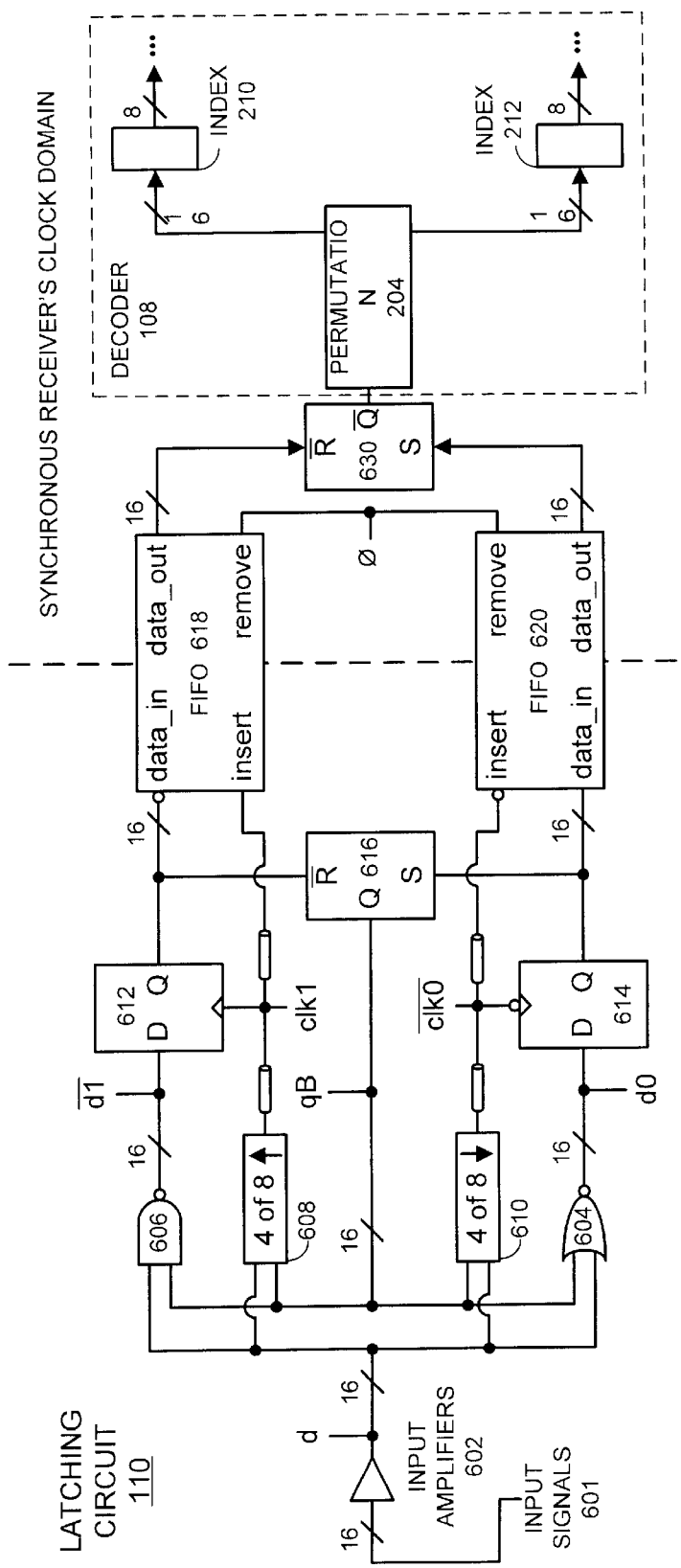
FIG. 6 illustrates a latching circuit in accordance with an embodiment of the present invention.

FIG. 6 illustrates latching circuit 107 from FIG. 1 in accordance with an embodiment of the present invention. This circuit provides separate paths for low-to-high and high-to-low transitions. In doing so, the circuit greatly reduces the need to match delays for rising and falling transitions, which can facilitate greater skew tolerance.

Referring to the left-hand side of FIG. 6, input amplifiers 602 convert input signals 601 from the low-voltage swing levels frequently used for off-chip signaling to the full-range signals used on-chip. This process is described in more detail below with reference to FIG. 7.

A four-of-eight rising transition detecting circuit (4-of-8 ↑) 608 detects when four inputs that had been low in the previous codeword make transitions to high levels. The design of such a circuit is described in more detail below with reference to FIG. 8. Note that NAND gates 606 cause $\overline{d1}$ to have a low value for each position where a signal made a low-to-high transition and a high value in the other bit positions. These values are stored in latch 612 when four low-to-high transitions have been detected. They are subsequently loaded into the FIFO 618 from latch 612.

The path for high-to-low transitions is similar. In this path, a four-of-eight falling transition detecting circuit (4-of-8 ↓) 614 detects when four inputs that had been high in the previous codeword make transitions to low levels. The design of such a circuit is similar to the design of the low-to-high transition detecting circuit illustrated in FIG. 8. Note that NOR gates 604 cause d0 to have a high value for each position where a signal made a high-to-low transition and a low value in the other bit positions. These values are stored in latch 614 when four high-to-low transitions have been detected. They are subsequently loaded into the FIFO 620 from latch 614.

$\overline{R/S}$ latch 616 records the bit values of the previous codeword. Moreover, the output qB of $\overline{R/S}$ latch 616 feeds into inputs of transition detecting circuits 608 and 610, NAND gates 606 and NOR gates 604.

Note that a rising transition from input amplifier 602 causes the corresponding output of NAND gate 606 to fall. When this low value is acquired by latch 616, the corresponding output of latch 616 is reset (i.e., the Q value is set low). A low value at the input of NAND gate 606 forces that output high, indicating that the signal is not a candidate for a subsequent rising transition, because it is already high. Similar reasoning applies for the path through NOR gate 614.

Also note that these exists a delay element between the output of edge detector 608 and the clock input of latch 612. This delay is to ensure that the setup requirement for latch 612 is satisfied. In many cases, this set-up time will be satisfied without additional delay and no delay element will be needed. In fact, there may be more setup time than required and the designer may instead choose to delay the data input to latch 612 to improve performance. The motivation for the delay element between the output of edge detector 610 and the clock input of latch 614 is the same. Furthermore, there exists a delay element from the clock input of latch 612 to the insert input of FIFO 618. This is to compensate for the propagation delay of latch 612. For the same reason, there exists a delay element between the clock input of latch 614 and the insert input of FIFO 620.

Moreover, note the outputs of FIFOs 618 and 620 are within the synchronous clock domain of receiver 104. These outputs feed into permutation circuit 204, which sorts the bits in the codewords to produces indices 210 and 212, respectively, as is illustrated in FIG. 2.

Also note that these exists a delay element between the output of edge detector 608 and the clock input of latch 612. This delay is to ensure that the setup requirement for latch 612 is satisfied. In many cases, this setup time will be satisfied without additional delay and no delay element will be needed. In fact, there may be more setup time than required and the designer may instead choose to delay the data input to latch 612 to improve performance. The motivation for the delay element between the output of edge detector 610 and the clock input of latch 614 is the same. Furthermore, there exists a delay element from the clock input of latch 612 to the insert input of FIFO 618. This is to compensate for the propagation delay of latch 612. For the same reason, there exists a delay element between the clock input of latch 614 and the insert input of FIFO 620.

Another R/S latch 630 exists at the output of the FIFOs. Note that the output of latch 630 is the original, encoded data.

A number of things can happen when rising and falling transitions encounter different delays. For example, assume that rising edges propagate slower. Then, the output of 4-of-8 detector 610 will trigger before that of 608. This will cause the indicators of falling edges to be loaded into latch 614 and then FIFO 620. The change of the outputs of latch 614 will cause the corresponding outputs of latch 616 to go high. Because the corresponding input lines are now low, this will not affect the outputs of NAND gate 606. The circuit is now in a state where the falling edges have been acquired, but it is still waiting for rising edges for the current codeword. Consider what happens if a falling edge for the next transition arrives before a rising edge for the current one. In this case, the falling edge will be indicated on the output of NOR gate 604, and will contribute to the 4-of-8 detector 610.

There are two scenarios that can arise from here. In the first scenario, the final rising edge for the current transition arrives before the final failing edge for the next transition. In this case, the indicators for the rising edge are acquired by latch 612 and FIFO 618, and the outputs of latch 616 are appropriately updated. If one of these signals is in the subsequent transition, NOR gate 604 will now be enabled to detect it.

In the second scenario, all of the falling edges for the next transition arrive before the last rising edge for the current transition. In the circuit as drawn in FIG. 6, this is only "safe" if the first transition caused four of the high wires from the previous codeword to fall, and the second transition caused the remaining four to fall. In this case, the second set of falling edges will be duly noted and loaded into the FIFO. On the other hand, if one signal rose and then fell again before some other signal rose, then the output of NAND gate 606 would drop, and then possibly go high again before latch 612 is clocked.

There are two solutions to this last problem. First, we could just accept this as a limit on the skew tolerance of the design. Alternatively, we could design latch 612 to be "zeros catching." Such a latch will output a low value on Q for any input that was low sometime since the last clock event. We want to design the latch so that it only became zeros catching after the indicators for the previous codeword had time to propagate through latch 616 and AND gate 606. Similar observations apply to the path through NOR gate 604.

Input Amplifier

Figure 7:
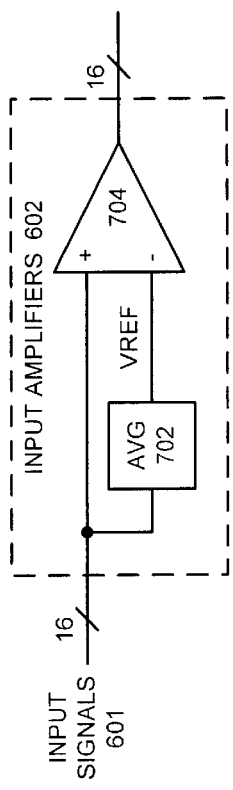
FIG. 7 illustrates an input amplifier circuit in accordance with an embodiment of the present invention.

FIG. 7 illustrates input amplifiers 602 in accordance with an embodiment of the present invention. Note that because every codeword contains an equal number of ones and zeros, a mid-point voltage reference, $V_{REF}$, can easily be generated using a voltage averaging circuit 702 to produce an average voltage across all input signals 601. Voltage averaging circuit 702 can be implemented using any one of a number of well-known techniques. For example, voltage averaging circuit 702 can be implemented using a current summing circuit.

Transition Detecting Circuit

Figure 8:
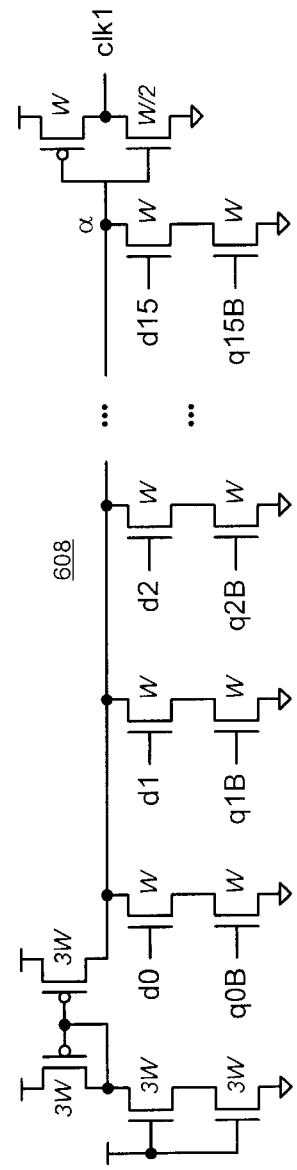
FIG. 8 illustrates a transition detecting circuit in accordance with an embodiment of the present invention.

FIG. 8 illustrates a transition detecting circuit 608 that detects a predetermined number of transitions in accordance with an embodiment of the present invention. More specifically, FIG. 8 illustrates a simple circuit that detects when four inputs that had been low become high. The current-mirror p-channel device on the left-hand side of FIG. 8, with a width of 3w, provides a reference current that matches the pull-down current when three inputs become high. (Note that bits of the current dataword are indicated by d0, d1, . . . , d15, and bits of the preceding dataword are indicated by q0B, q1B, . . . , q15B.) When four inputs are high, node α drops, and the clk1 output goes high. Note that when three inputs have changed, the clk1 output can move to an intermediate value. Data kiting is being employed here. The assumption is that the transition on the clk1 output will be slow enough when three inputs have changed, that the fourth will change before clk1 makes its transition.

This design can be tuned to provide a trade-off between speed and skew-tolerance. By reducing the size of the pull-up, the clk1 output will change sooner, but the design looses skew tolerance. By increasing the size of the pull-up, the clk1 output will change later, but the design will enjoy greater skew tolerance. Obviously, the width of the pull-up must be less than 4w. Using the implementation shown here, the last transition of the current codeword must arrive before the first transition of the next codeword.

Skew Tolerance

Let π be the clock period, σ be the residual skew after any adaptive skew tuning has been applied, and let τ be the sum of the setup and hold times of the latches. (Note that the term "residual skew" refers to the difference between arrival times for transitions on different wires on the channel.) Assume that delays can be added appropriately to ensure that the clock signals $\overline{clk0}$ and clk1 are nominally placed at the optimal point with respect to d0 and $\overline{d1}$. With this assumption, correct operation requires that $$\pi > \sigma + \tau.$$

With the 4-of-8 transition detecting circuits 608 and 610 illustrated in FIG. 6, we can detect upward and downward transitions separately. With this separation, the skew condition can be relaxed to the following: the last upward transition of the current codeword must arrive before the first upward transition of the next codeword, and the last downward transition of the current codeword must arrive before the first downward transition of the next codeword. Let "σ↑" denote the skew for upward transitions and let "σ↑" denote the skew for downward transitions. The design with separated transitions can operate correctly if $$\pi > \max(\sigma\downarrow, \sigma\uparrow) + \tau.$$

To compare with a design with forwarded clock signals, note that the clocks could be earliest transitions, or the latest. Assume that the clock and data transitions are simultaneous at the sender. Let χ be the delay from the arrival of a clock event until triggering the receiver's latch. To ensure that the set-up requirement of the latch is satisfied when the clock event is the earliest arrival (i.e. before any data), $\chi \geq \sigma + t_{set-up}$ must hold. Likewise, to ensure that the hold requirement is satisfied when the clock event is the latest arrival (i.e. after all the data), $\pi \geq \chi + \sigma + t_{hold}$. Combining these two yields $\pi > 2\sigma + \tau$.

Process of Latching a Codeword

Figure 9:
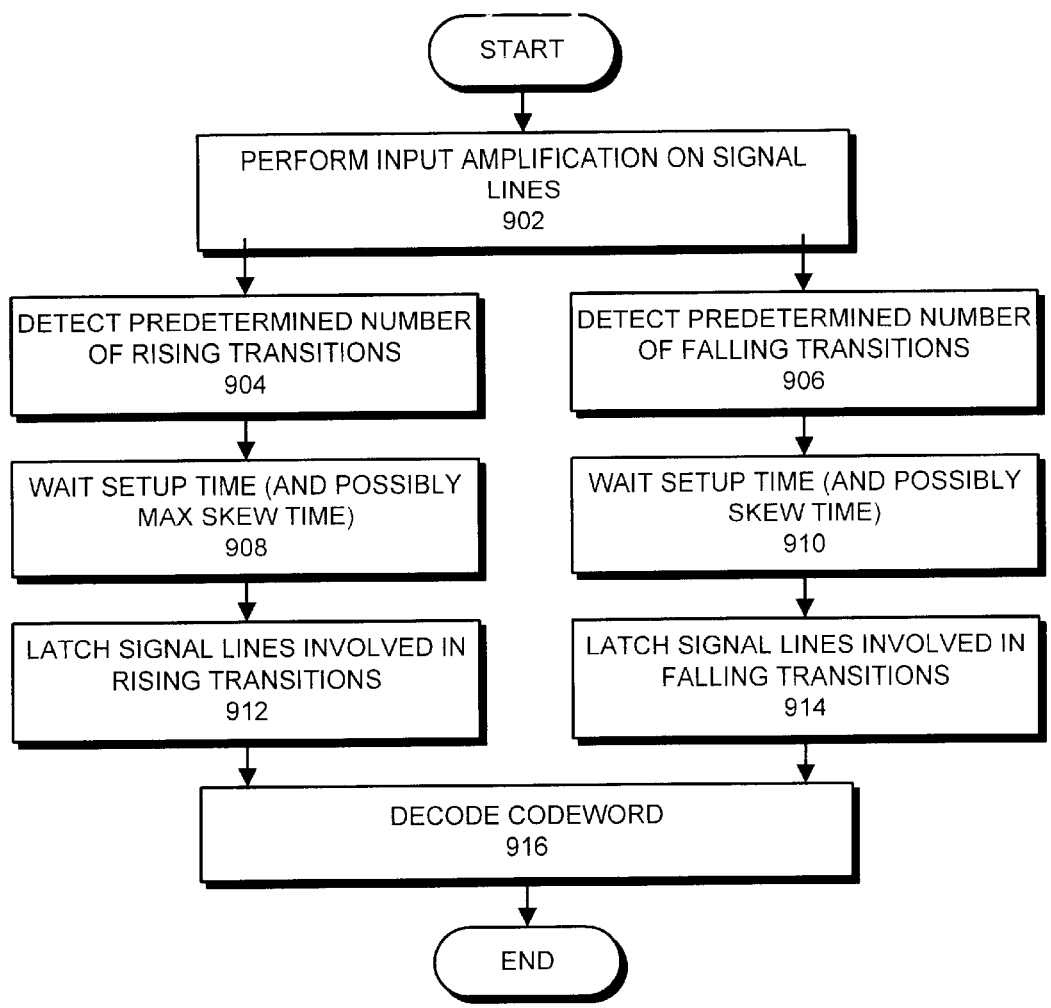
FIG. 9 is a flow chart illustrating the process of latching a dataword from a signal line in accordance with an embodiment of the present invention.

FIG. 9 is a flow chart illustrating the process of latching a codeword from a signal line in accordance with an embodiment of the present invention. The system starts by performing input amplification on input signals 601 using input amplifiers 602 (step 902). As was described above, input amplifiers 602 can derive a reference voltage by averaging the voltage of input signals 601. Next, the circuit illustrated in FIG. 6 provides separate circuits for rising transitions and falling transitions.

For rising transitions, the system uses 4-of-8 ↑ circuit 608 to detect a predetermined number of rising transitions (step 904). Note that any number of transitions from one to four can possibly be used. After the predetermined number of rising transitions is detected, the system waits for a fixed period of time, which can include the latch setup time and possibly the skew time (step 908). Note that skew time is not applicable if four of eight transitions are detected, because after the fourth transition, no more transitions will occur. Hence, all that remains is the latch setup time. In contrast, if only one transition is detected, the system has to wait a certain amount of time to guarantee that the other three transitions have occurred in addition to the latch setup time.

The system then latches all signal lines involved in rising transitions (step 912). This includes all signal lines that start out at a low level in the preceding codeword. Some of these signal lines make rising transitions while other signal lines remain at the low level.

For falling transitions, the system uses 4-of-8 ↓ circuit 610 to detect a predetermined number of falling transitions (step 906). After the predetermined number of rising transitions is detected, the system waits for a fixed period of time, which can include the latch setup time and possibly the skew time (step 910). The system then latches all signal lines involved in rising transitions (step 914). This includes all signal lines that start out at a high level in the preceding codeword. Some of these signal lines make falling transitions while other signal lines remain at the high level.

Finally, the system decodes the codeword using decoder 108 as is described above with reference to FIG. 6 (step 916).

Exemplary Scenarios

Figure 10:
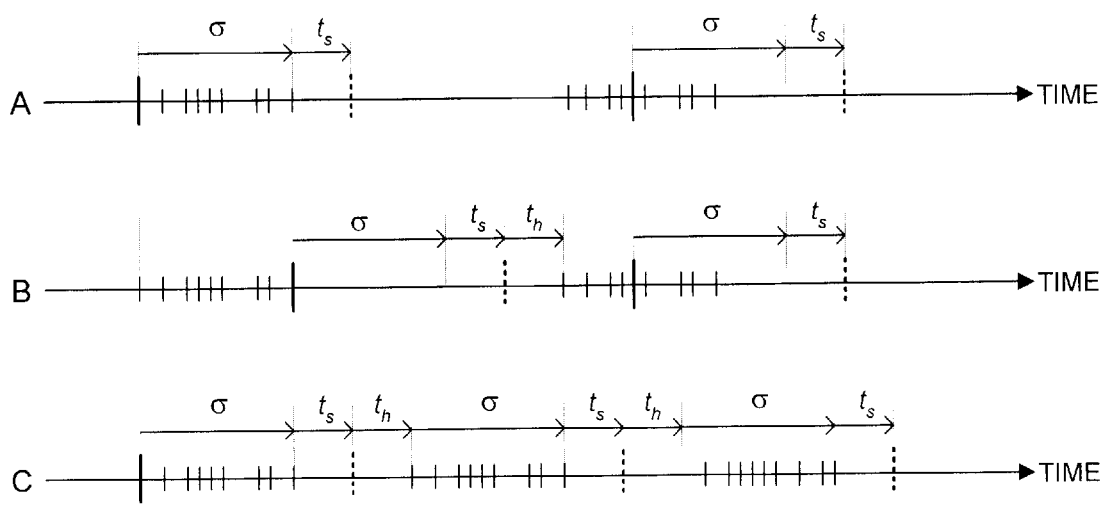
FIG. 10 depicts scenarios A and B.

Referring to FIG. 10, scenarios A and B depict operation of an interface where a separate clock signal is forwarded along with the data, and scenario C depicts operation where data latching is triggered by the last of a predetermined number of transitions. Furthermore, scenario A shows the situation where the separate clock has the smallest delay of all signals in the interface, and scenario B shows operation when the forwarded clock has the largest delay. In all scenarios, $\sigma$ denotes the skew, $t_s$ is the latch set-up time, and $t_h$ is the latch hold time. Thick, vertical segments denote events on the forwarded clock; thin, vertical segments denote events on the data signals. Thick dashed lines denote the clock for the input latch.

To guarantee correct operation in scenario A, the time from the arrival of the forwarded clock until the clock event on the data latch must be at least $\sigma + t_s$. This delay must also hold in scenario B because the designer does not know in advance which scenario applies. The first event for the next codeword transition must occur no earlier than $t_h$ after the clock even on the input latch. To accommodate both scenario A and scenario B the clock input must be at least $2\sigma + t_s + t_h$.

In the present invention, the data is latched by a clock derived by the last event to arrive. Scenario C depicts this operation. The time from the last event to the clock for the input latch must be $t_s$, and the time until the first event of the last codeword transition must be at least $t_h$. This allows the interface to operate with a minimum skew period of $\sigma + t_s + t_h$. The added robustness to errors described above may easily justify the slightly lower transmission rate compared with the latching scheme that triggers on the last event.

When the $k^{th}$ event is used to generate the internal clock, more analysis is needed. Basically, if k is neither very small (e.g. the first event) nor very large (e.g. the last event), then for many skew distributions, the $k^{th}$ input event must be close to the middle of the skew interval. This allows a minimum interval between codewords of less than $2\sigma + t_s + t_h$ (but greater than $\sigma + t_s + t_h$). The added robustness to errors described above may easily justify the slightly lower transmission rate compared with the latching scheme that triggers on the last input event.

Variations

There exist a large number of variations on the present invention. This disclosure has so far focused on the example of doubly balanced codes. However, many of the concepts remain applicable without the balancing. Thus, we can have a code with n wires connecting the transmitter and the receiver, where in at least p and at most q transition between successive codewords. The number of possible $$\sum_{i=p}^{q} \binom{n}{i}$$

For example, if $p = \lfloor n/2 \rfloor$ and $q = n$, then there are at least $2^{n-1}$ possible transitions between codewords. These codes are commonly used for serial transmission of data. (e.g. 4/5 codes), but have so far not been used for parallel transmission.

A code like the one described above offers embedded timing and the skew tolerance advantages that have been described for doubly balanced codes without offering the balancing advantages. However, for a fixed number of wires, they send more bits per codeword. For example, with n=16, p=8, and q=16, the resulting code conveys 15 bits of information per codeword, while the doubly balanced code only convey 12 bits.

We can extend this idea to codes with balanced transitions as well. Consider a code with n wires where for codeword n/2 are high and n/2 are low. We can consider a code wherein at least p and at most q low signals transition to high between codewords, and an equal number of high signals make downward transitions. The number of codewords is $$\sum_{i=p}^{q} \binom{n/2}{i}^2$$

For example, if n=16, p=8, and q=16, we get 8820 transitions between codewords, which is enough to convey 13 bits per codeword. We can extend this to the case where the number of high and low wires in each codeword is "substantially equal." Let n=15, and consider a code where each word as either 7 or 8 low wires (and therefore either 8 or 7 high wires). Furthermore, assume that the number of upward and downward transitions between successive codewords can differ by 0 or 1.

We start by looking at codewords with 7 low wires, and consider transitions with 3 or 4 upward transitions, and 3 to 5 downward transitions. The number of transitions is:

$$\binom{7}{3}\left[\binom{8}{3}+\binom{8}{4}\right]+\binom{7}{4}\left[\binom{8}{4}+\binom{8}{5}\right]=8820$$

If the number of upward and downward transitions are equal, the resulting codeword has seven low wires and eight high. On the other hand, if there is one more downward transition than upward, then the resulting codeword has eight low wires and seven high. In either case the "substantial equality" of low and high wires is preserved. By symmetry there are 8820 transitions out of codewords with 8 high wires. Thus, this code carries 13 bits per codeword using only 15 wires.

Similar arguments can be applied to the code over 16 wires where each codeword has 7, 8, or 9 zeros (and therefore 7, 8, or 9 ones) and in which each transition between successive codewords has the number of upward and downward transitions differ by at most one. Such a code can convey 14 bits per codeword.

The encoders and decoders for words where the number of zeros and ones in each codeword are "substantially equal" may be "substantially" more complicated. The obvious implementation has different lookup tables for each number of ones or zeros in the preceding codeword. For the code with 14 wires described above, two sets of lookup tables are needed. The code with 16 wires and 14 bits per codeword could also be done with two tables (noting the symmetry between the 7 zeros and 9 ones codewords with the 9 zeros and 7 ones codewords).

Having described these various codes, we note that the doubly balanced codes are more complicated to describe than the "n out of m" codes.

An advantage of the latching scheme described above is its robustness to errors in transmission. If a code guarantees m transitions between successive codewords, and the latching event is triggered on receiving k transitions, with k<m, then a latching event will be triggered even if m−k of the transitions fail to be received. Likewise, there will be no spurious latching event even if k−1 spurious transitions are received. Obviously, erroneous data will be received in these cases. Error detecting techniques can be applied to deal with such errors. This robustness is in contrast with "delay insensitive" codes as described in "Delay Insensitive Codes—An Overview" by Tom Verhoeff, Distributed Computing. 3:1–8, 1988. With delay insensitive codes, if a transition is dropped, then the receiver will fail to latch a codeword, causing the interfaces to loose synchronization. Generally, his requires re-initializing the interface after an error. The codes described in this disclosure are more robust: errors can be detected and corrected, and the interface can continue to operate without interruption.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for using completion detection to latch a dataword in a stream of datawords, wherein each transition between successive datawords involves a minimum number of transitions on a set of signal lines, the method comprising:
monitoring the set of signal lines that carries the stream of datawords;
upon detecting a predetermined number of transitions on the set of signal lines,
waiting a fixed time interval to ensure that the dataword is ready to be latched, and then
latching the dataword.

2. The method of claim 1, wherein each transition between datawords involves a substantially equal number of rising and falling transitions.

3. The method of claim 2, wherein each dataword in the stream of datawords has a substantially equal number of ones and zeros.

4. The method of claim 2,
wherein monitoring the set of signal lines involves using separate circuits to monitor rising and falling transitions; and
wherein detecting the predetermined number of transitions involves using separate circuits to detect a predetermined number of rising transitions and a predetermined number of falling transitions; and
wherein latching the dataword involves using separate circuits to latch signal lines involved in rising transitions and signal lines involved in falling transitions.

5. The method of claim 1, wherein the fixed time interval includes latch setup time.

6. The method of claim 5, wherein the fixed time interval includes a maximum skew, which accounts for the maximum possible skew between when the predetermined number of transitions occurs and when all signals lines for the dataword are valid.

7. The method of claim 1, wherein the predetermined number of transitions can include any number of transitions, from a single transition to the minimum number of transitions between successive datawords.

8. The method of claim 7, wherein the predetermined number of transitions is substantially half the minimum number of transitions between successive datawords.

9. The method of claim 7, wherein the predetermined number of transitions is the minimum number of transitions between successive datawords.

10. The method of claim 1, wherein detecting the predetermined number of transitions involves performing current summing.

11. The method of claim 1, further comprising performing input amplification on the set of signal lines;
wherein the input amplification involves performing a voltage averaging operation over the set of signal lines to determine a reference voltage for the input amplification.

12. The method of claim 11, wherein performing the voltage averaging operation involves using a current summing circuit.

13. An apparatus for using completion detection to latch a dataword in a stream of datawords, wherein each transition between successive datawords involves a minimum number of transitions on a set of signal lines, the apparatus comprising:
a transition detecting circuit that is configured to monitor the set of signal lines that carries the stream of datawords;
a latching circuit, wherein upon detecting a predetermined number of transitions on the set of signal lines, the latching circuit is configured to,
wait a fixed time interval to ensure that the dataword is ready to be latched, and then to
latch the dataword.

14. The apparatus of claim 13, wherein each transition between datawords involves a substantially equal number of rising and falling transitions.

15. The apparatus of claim 14, wherein each dataword in the stream of datawords has a substantially equal number of ones and zeros.

16. The apparatus of claim 14,
wherein the transition detecting circuit includes separate circuits for detecting rising and falling transitions; and
wherein the predetermined number of transitions includes a predetermined number of rising transitions and a predetermined number of falling transitions; and
wherein latching circuit includes separate circuits to latch signal lines involved in rising transitions and signal lines involved in falling transitions.

17. The apparatus of claim 13, wherein the fixed time interval includes latch setup time.

18. The apparatus of claim 17, wherein the fixed time interval includes a maximum skew, which accounts for the maximum possible skew between when the predetermined number of transitions occurs and when all signals lines for the dataword are valid.

19. The apparatus of claim 13, wherein the predetermined number of transitions can include any number of transitions, from a single transition to the minimum number of transitions between successive datawords.

20. The apparatus of claim 19, wherein the predetermined number of transitions is substantially half the minimum number of transitions between successive datawords.

21. The apparatus of claim 19, wherein the predetermined number of transitions is the minimum number of transitions between successive datawords.

22. The apparatus of claim 13, wherein the transition detecting circuit operates by performing current summing.

23. The apparatus of claim 13, further comprising:
a set of input amplifiers for the set of signal lines; and
a voltage averaging circuit that averages voltage over the set of signal lines to determine a reference voltage for the set of input amplifiers.

24. The apparatus of claim 23, wherein the voltage averaging circuit operates by performing current summing.

25. A computer system that performs completion detection to latch a dataword in a stream of datawords, wherein each transition between successive datawords involves a minimum number of transitions on a set of signal lines, the computer comprising:
a processor;
a memory;
the set of signal lines, wherein the set of signal lines is configured to carry the stream of datawords between components in the computer system;
a transition detecting circuit that is configured to monitor the set of signal lines;
a latching circuit, wherein upon detecting a predetermined number of transitions on the set of signal lines, the latching circuit is configured to,
wait a fixed time interval to ensure that the dataword is ready to be latched, and then to
latch the dataword.

26. The computer system of claim 25, wherein each transition between datawords involves a substantially equal number of rising and falling transitions.

27. The computer system of claim 26, wherein each dataword in the stream of datawords has a substantially equal number of ones and zeros.

28. The computer system of claim 26,
wherein the transition detecting circuit includes separate circuits for detecting rising and falling transitions; and
wherein the predetermined number of transitions includes a predetermined number of rising transitions and a predetermined number of falling transitions; and
wherein latching circuit includes separate circuits to latch signal lines involved in rising transitions and signal lines involved in falling transitions.

* * * * *